United States Patent
Jomaa et al.

(10) Patent No.: US 7,494,913 B2
(45) Date of Patent: Feb. 24, 2009

(54) MICROBALL PLACEMENT SOLUTIONS

(75) Inventors: Houssam Jomaa, Chandler, AZ (US); Ravi K. Nalla, Chandler, AZ (US); H. Ryan Chase, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 127 days.

(21) Appl. No.: 11/514,824

(22) Filed: Aug. 31, 2006

(65) Prior Publication Data

US 2008/0054047 A1 Mar. 6, 2008

(51) Int. Cl.
*H01L 21/441* (2006.01)
*B23K 35/14* (2006.01)

(52) U.S. Cl. .................. 438/613; 228/45; 228/246

(58) Field of Classification Search ................ 438/613; 228/45, 246
See application file for complete search history.

(56) References Cited

U.S. PATENT DOCUMENTS

| | | | | |
|---|---|---|---|---|
| 5,255,840 A | * | 10/1993 | Nowotarski | 228/254 |
| 5,467,913 A | * | 11/1995 | Namekawa et al. | 228/41 |
| 5,540,377 A | * | 7/1996 | Ito | 228/41 |
| 5,839,641 A | * | 11/1998 | Teng | 228/41 |
| 6,056,190 A | * | 5/2000 | Foulke et al. | 228/246 |
| 6,253,992 B1 | * | 7/2001 | Fjelstad | 228/245 |
| 6,329,637 B1 | * | 12/2001 | Hembree et al. | 219/209 |
| 6,630,837 B2 | * | 10/2003 | Wark | 324/758 |
| 7,122,748 B2 | * | 10/2006 | Yamada | 174/521 |
| 7,131,195 B2 | * | 11/2006 | Akram | 29/843 |
| 2008/0003802 A1 | * | 1/2008 | Pang et al. | 438/612 |
| 2008/0003805 A1 | * | 1/2008 | Pang et al. | 438/613 |

OTHER PUBLICATIONS

"Development of Microball Bumping Technology for 150 um Pad Pitch", Bump Dept., Planning & Administration Div., New Materials Division,32 & 33, date unknown.
Shimokawa, Kenji , et al., "Micro-ball Bump for Flip Chip Interconnections", *IEEE*, (1998),1472-1476.
U.S. Appl. No. 11/437,029, Nalla et al., filed May 9, 2006.
U.S. Appl. No. 11/478,754, Nalla et al., filed Jun. 29, 2006.

* cited by examiner

*Primary Examiner*—Evan Pert
(74) *Attorney, Agent, or Firm*—Kathy J. Ortiz

(57) ABSTRACT

Microball delivery solutions for solder bumping are generally described. In this regard, according to one example embodiment, a microball delivery assembly includes a mask with at least two microball holder(s) to hold at least two different sizes of microball(s) that may correspond with at least two different-sized openings on a substrate, to provide simultaneous delivery of different-sized microballs upon a substrate.

22 Claims, 5 Drawing Sheets

MICROBALL PLACEMENT SOLUTIONS

TECHNICAL FIELD

Embodiments of the present invention are generally directed toward solder bump formation and, more particularly, to microball placement techniques.

BACKGROUND

Generally, solder bumping includes placing solderable material on bonding pads of a chip substrate and then reflowing the solderable material to form attached solder bumps on the bonding pads. A number of solder bump forming methods exist according to the prior art. In a common method, illustrated in FIGS. 1 and 2, a stencil mask printing method 100, 200 is used wherein solder paste 102, is squeezed through openings in a metal mask 104 and openings in a solder resist layer 106 onto bonding pads 110 located on the surface of a substrate 108. After mask 104 removal, the placed solder 102 is heated or reflowed to melt the solder 102 to form bumps 202 on the bonding pads 208 of the substrate 206. The stencil printing method and associated methods may not be suited for future platforms that require decreasing solder pitch and bump sizes. Stencil mask printing at fine pitches (i.e.—less than about 150 μm) results in mask lift-off, missing bumps, bump voiding, and excessive bump height variation, thus negatively affecting die attachment yields.

Alternative bumping techniques are being investigated to overcome these limitations. Microball delivery is one such technique that has elicited interest owing to its ability to produce relatively void-free bumps with excellent bump height control. However, delivery methods available today may be restricted to substrates with a single solder resist opening (SRO) size. Current microball techniques cannot deliver microballs of different sizes to mixed pitch and mixed size SROs without using a multiple delivery and placement process, with concomitant increased costs and lowered throughput time. For example, substrates with mixed SROs may currently require a delivery process for each SRO/microball size. Separate delivery of different-sized microballs may also require multiple reflow steps. Solutions for improved microball delivery and placement in a more cost and time efficient manner are needed.

BRIEF DESCRIPTION OF THE DRAWINGS

Embodiments of the present invention are illustrated by way of example, and not by way of limitation, in the figures of the accompanying drawings in which like reference numerals refer to similar elements and in which.

DETAILED DESCRIPTION

Embodiments of a microball delivery assembly and corresponding methods and products are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the description.

Reference throughout this specification to "one embodiment" or "an embodiment" means that a particular feature, structure or characteristic described in connection with the embodiment is included in at least one embodiment of the present description. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
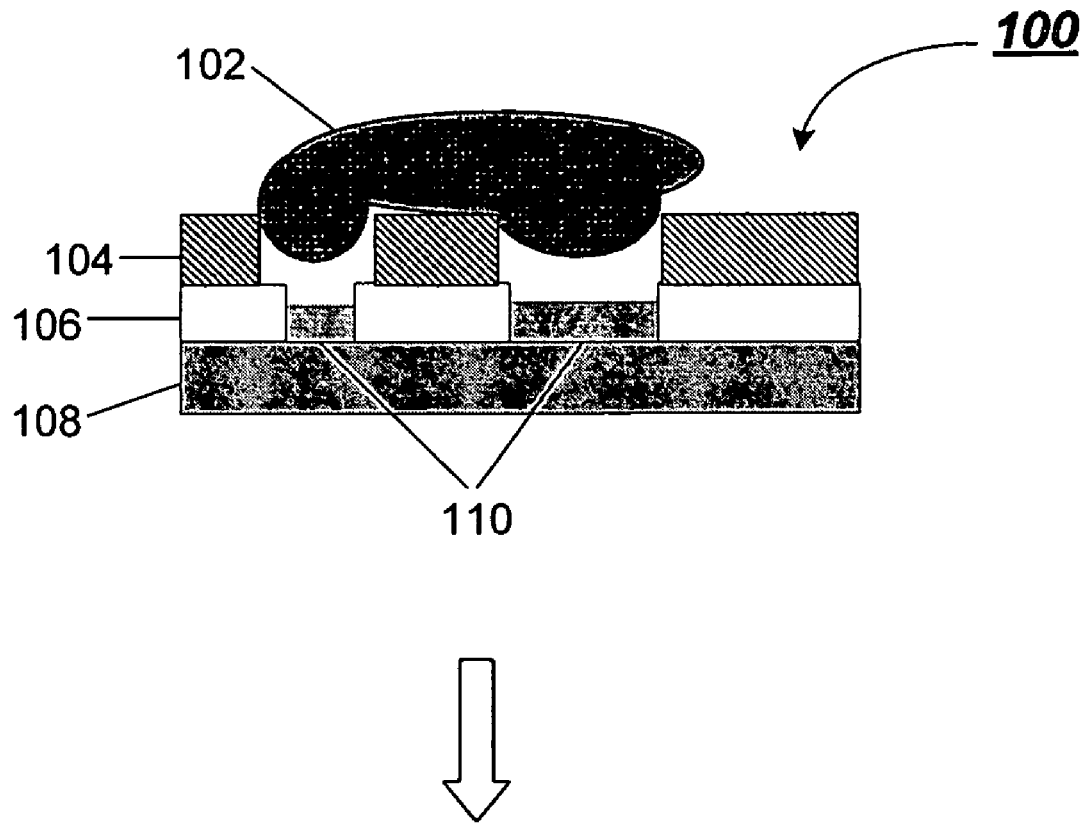
FIG. 1 is a side view of a first step of a stencil printing method (Prior Art), according to but one example embodiment.
Figure 2:
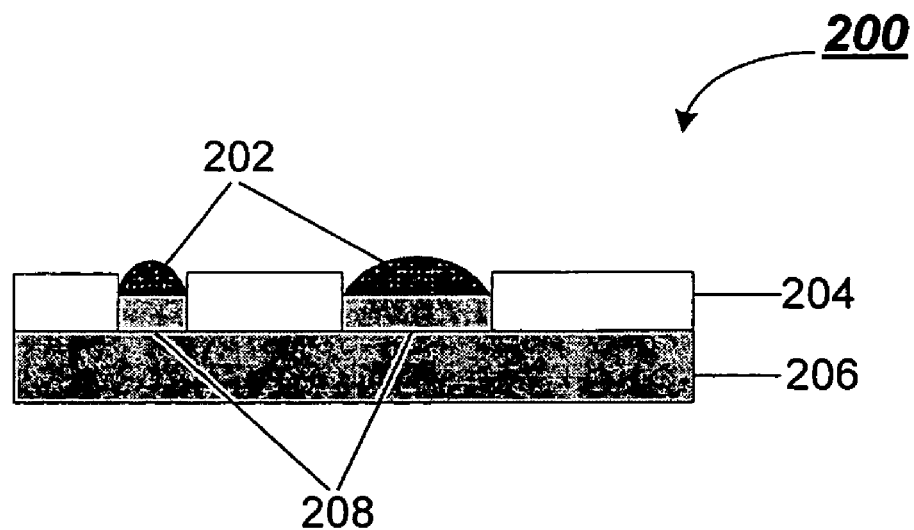
FIG. 2 is a side view of a second step of a stencil printing method (Prior Art), according to but one example embodiment.
Figure 3:
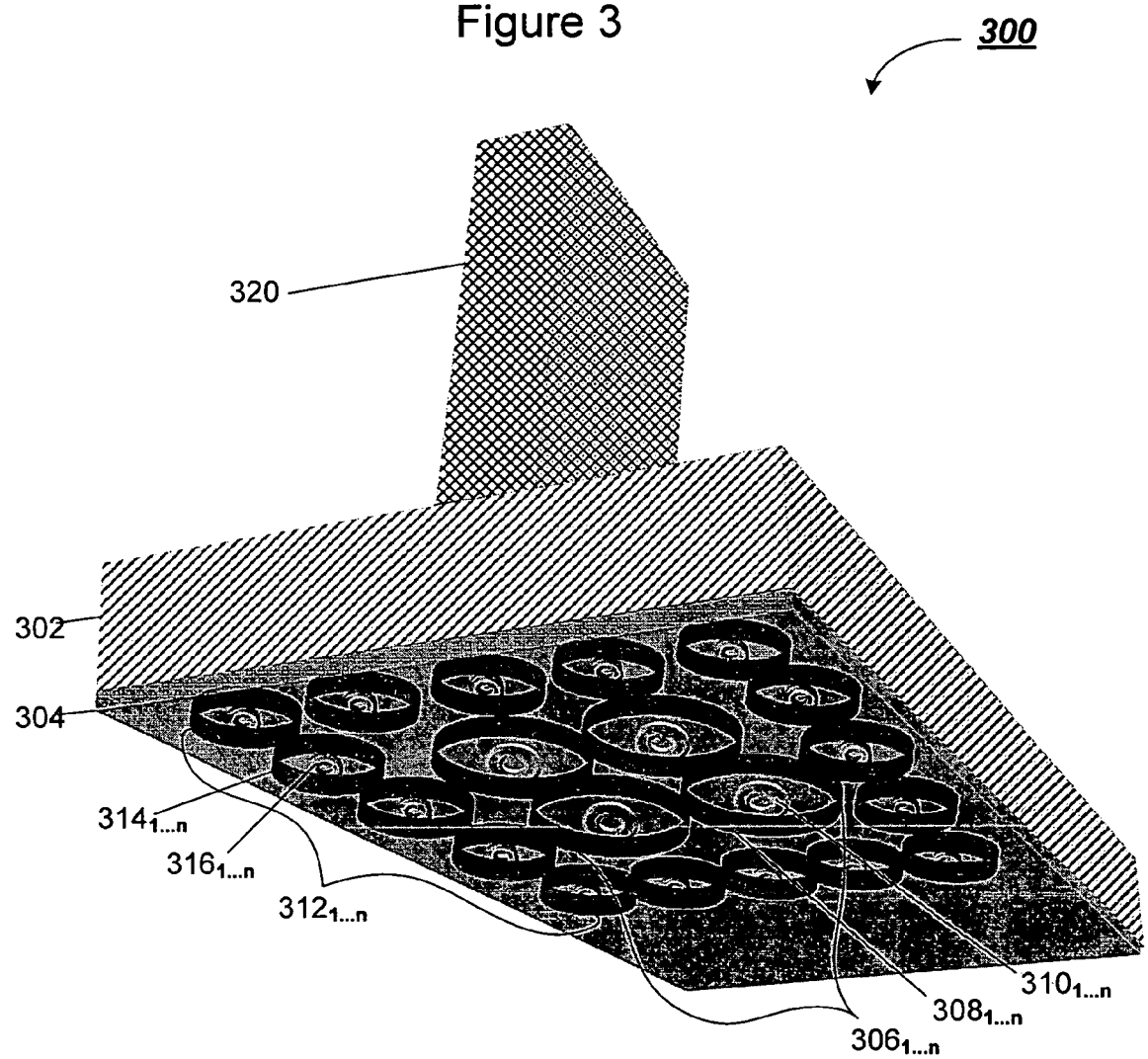
FIG. 3 is an isometric view of a microball delivery assembly, according to but one example embodiment.

FIG. 3 is an isometric view of a microball delivery assembly 300, according to but one example embodiment. In one embodiment, a microball delivery assembly 300 includes a mask holder 302, a mask 304, one or more first microball holder(s) $306_{1 \ldots n}$ (where n represents a variable number of repeating structures), and one or more second microball holder(s) $312_{1 \ldots n}$, each coupled as shown.

In one embodiment, mask 304 includes one or more first microball holder(s) $306_{1 \ldots n}$ to hold microball(s) of a first diameter and one or more second microball holder(s) $312_{1 \ldots n}$ to hold microball(s) of a second diameter, different from the first diameter. First and second microball holder(s) $306_{1 \ldots n}$, $312_{1 \ldots n}$ are designed to hold microball(s) of different sizes. Such design allows a single delivery assembly 300 to pick up and simultaneously place different-sized microballs at a desired location.

In another embodiment, mask 304 includes one or more other microball holder(s) to hold one or more microball(s) of other diameters, different than a first and second diameter, through the other microball holder(s). In other words, assembly 300 is not limited to only first and second microball holder(s), but may include third or more microball holder(s) to hold microballs of third or more diameters.

In one embodiment, one or more first microball holder(s) $306_{1 \ldots n}$ are a first size and one or more second microball holder(s) $312_{1 \ldots n}$ are a second size different from the first size. Different-sized microball holder(s) $306_{1 \ldots n}$, $312_{1 \ldots n}$ allows a single delivery assembly 300 to pick up and simultaneously place different-sized microballs at a desired location. In an embodiment, the first microball holder(s) $306_{1 \ldots n}$ are larger than the second microball holder(s) $312_{1 \ldots n}$. In other embodiments, other microball holder(s) of sizes different than the first and second microball holder(s) $306_{1 \ldots n}$, $312_{1 \ldots n}$ are coupled to mask 304 to hold microball(s) of sizes different than those suitable for first and second microball holder(s) $306_{1 \ldots n}$, $312_{1 \ldots n}$. In other words, assembly 300 is not limited to a mask 304 with only two different sized microball holder(s) $306_{1 \ldots n}$, $312_{1 \ldots n}$, but may also include three or more different-sized microball holder(s).

In an embodiment, first $306_{1 \ldots n}$ and second $312_{1 \ldots n}$ microball holder(s) hold and place microballs suitable for bumping the surface of a microelectronic substrate. A substrate may have different-sized solder-resist openings (SRO) to receive different-sized microballs. A substrate may also have different pitch between microballs. Microball holder(s) $306_{1...n}$, $312_{1...n}$ may be arranged to match a selected microball placement pattern on the surface of a substrate in consideration of at least microball size and pitch. A mask 304 with holder(s) $306_{1...n}$, $312_{1...n}$ that are arranged to match a desired SRO map facilitates simultaneous delivery of different-sized microballs to different-sized SROs with mixed pitch. In one embodiment, holder(s) $306_{1...n}$, $312_{1...n}$ are designed to hold microball(s) ranging in size between about 40-200 microns in diameter, with a center-to-center pitch ranging between about 40-250 microns.

In another embodiment, holder(s) $306_{1...n}$, $312_{1...n}$ hold and place microballs made of solderable material. Solderable material, as referenced in this description, is any of various solderable materials, including fusible alloys such as lead or tin, to join parts. In an embodiment, microballs suitable for use with a microball delivery assembly 300 include solder alloys comprising tin-lead, tin-silver, or tin-silver-copper alloy systems, but are not limited to these materials and may include any suitable solderable material for bumping a microelectronic substrate.

In another embodiment, the second microball holder(s) $312_{1...n}$ is able to support the weight of microball(s) associated with the second microball holder(s) $312_{1...n}$, but is not able to support the weight of microball(s) associated with the first microball holder(s) $306_{1...n}$. Such an embodiment prevents picking up larger microballs intended for first microball holder(s) $306_{1...n}$ with the second microball holder(s) $312_{1...n}$.

In another embodiment, the first $306_{1...n}$ and second $312_{1...n}$ microball holder(s) are arranged such that the distal surfaces of any attached microball(s) are substantially coplanar, the distal surfaces being distal in relation to the proximal surfaces that are proximate to the first $306_{1...n}$ and second $312_{1...n}$ microball holder(s). In one example, the first microball holder(s) $306_{1...n}$ are larger than second microball holders $312_{1...n}$ and the first microball holder(s) $306_{1...n}$ are recessed toward assembly support 320 by a distance such that the substrate-contacting surfaces of any microballs held by the first $306_{1...n}$ and second $312_{1...n}$ microball holder(s) are substantially coplanar. Substrate-contacting surface refers to the portion of the microball that is intended or most likely to come into contact with the bonding pads of a microelectronic substrate upon placement and does not necessarily mean that the microball is actually contacting the substrate or pads.

According to one embodiment, one or more first microball holder(s) $306_{1...n}$ include microball supports $308_{1...n}$ and vacuum nozzles $310_{1...n}$ to support and hold suitably-sized microball(s) and one or more second microball holder(s) $312_{1...n}$ include microball supports $314_{1...n}$ and vacuum nozzles $316_{1...n}$ to support and hold suitably-sized microball(s).

According to another embodiment, microball delivery assembly 300 further includes an assembly support 320 to couple the mask holder 302 and mask 304 with other elements, devices, assemblies, or systems. In one embodiment, assembly support 320 includes vacuum lines to provide differential suction to mask holder 302, mask 304 and/or first $306_{1...n}$ and second $312_{1...n}$ microball holder(s). Vacuum lines may provide selective suction to holder(s) $306_{1...n}$ and $312_{1...n}$ to hold and place microball(s). In one embodiment, holder(s) $306_{1...n}$ and $312_{1...n}$ are controlled by separate vacuum systems.

In an embodiment, microball delivery assembly 300 is coupled to one or more device(s) or system(s) for creating suction. Device(s) for creating suction may provide differential suction to the microball holder(s) $306_{1...n}$, $312_{1...n}$ to selectively hold and place microballs. In an embodiment, one or more device(s) for creating suction are coupled with the mask holder or mask to provide differential suction to the mask for selectively holding and placing different-sized microball(s) into corresponding openings on a microelectronic substrate. More detailed embodiments of vacuum lines or pathways in a microball delivery assembly 300 are described below in FIG. 4.

Figure 4:
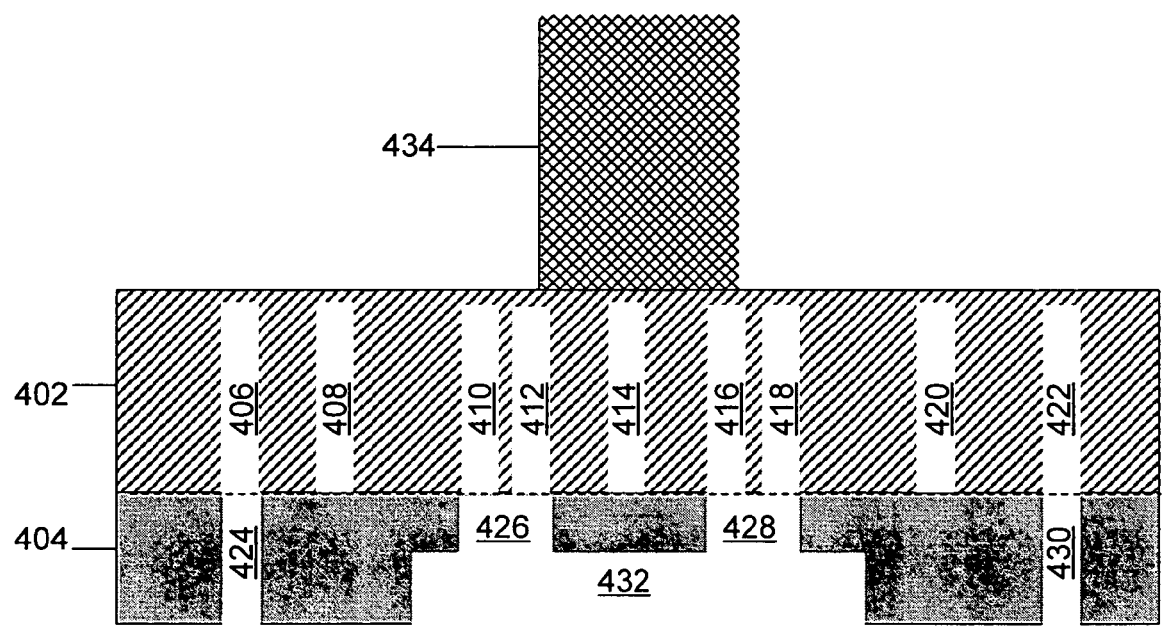
FIG. 4 is a cross-sectional side view of a microball delivery assembly, according to but one example embodiment.

FIG. 4 is a cross-sectional side view of a microball delivery assembly 400, according to but one example embodiment. In one embodiment, microball delivery assembly 400 includes assembly support 434, a mask holder 402 including vacuum pathways 406, 408, 410, 412, 414, 416, 418, 420, 422, and a mask 404 including vacuum pathways 424, 426, 428, 430, and recessed area 432, each coupled as shown.

In an embodiment, mask holder 402 is a generic vacuum chuck with addressable suction designed to accept many different microball placement masks 404. In one embodiment, a mask holder 402 includes one or more first vacuum pathway(s) 410, 412, 416, 418 to provide selective suction to hold and place one or more microball(s) of a first diameter and one or more second vacuum pathway(s) 406, 422 are included in the mask holder 402 to provide selective suction to hold and place one or more microball(s) of a second diameter. Other pathway(s) may be included in the mask holder 402 to provide selective suction to hold and place microball(s) of other diameters. In one example embodiment, microball(s) of a first diameter are about 80-100 microns in diameter and microball(s) of a second diameter are about 55-75 microns in diameter, but are not necessarily limited to this range. In one embodiment, first vacuum pathway(s) 410, 412, 416, 418 and second vacuum pathway(s) 406, 422 are controlled by separate vacuum systems. Such an embodiment may provide differential and selective pressure to first and second pathway(s) 410, 412, 416, 418, 406, 422 to pick up, hold and simultaneously place different-sized microballs at a desired location.

In an embodiment, mask holder 402 includes one or more first vacuum pathway(s) 410, 412, 416, 418 that can be aligned to one or more vacuum pathway(s) 426, 428 of the mask 404, as illustrated in one example, such that pathway(s) 410 and 412 are aligned with pathway 426 and pathway(s) 416 and 418 are aligned with pathway 428. Such alignment between the pathway(s) 410, 412, 416, 418 of the mask holder 402 and pathway(s) 426, 428 of the mask 404 provides a continuous path for selective suction to hold and place different-sized microball(s). In one embodiment, pathway(s) 410, 412, 416, 418 of the mask holder and pathway(s) of the mask 426, 428 provide suction for microball(s) that are relatively larger than microball(s) that may be held by pathway(s) 406, 422 and pathway(s) 424, 430. Combining two vacuum pathway(s) from the mask holder (i.e. 410 and 412) with one vacuum pathway from the mask (i.e. 426) is but one method for providing greater suction capability to the mask 404. Other methods such as providing a different suction system that provides greater suction power for a given pathway(s) are also envisioned and likewise fall within the spirit and scope of this description.

In accordance with an embodiment, mask holder 402 also includes one or more second vacuum pathway(s) 406, 422 that can be aligned to one or more vacuum pathway(s) 424, 430 of the mask 404, as illustrated, such that pathway 406 is aligned with pathway 424 and pathway 422 is aligned with pathway 430. Such alignment provides a continuous path for selective suction to hold and place microball(s). In one embodiment, pathway(s) 406 and 422 of the mask holder and pathway(s) 424 and 430 provide suction for microball(s) that are relatively smaller than microball(s) that may be held by pathway(s) 410, 412, 416, 418 of the mask holder and pathway(s) 426, 428 of the mask.

According to other embodiments, mask holder 402 includes one or more vacuum line(s) or pathway(s) 408, 414, 420 that may not align with vacuum pathway(s) on a mask 404. Such pathway(s) 408, 414, 420 may be used to hold the mask 404 to the mask holder 402 via suction. Alternatively, pathway(s) 408, 414, 420 may be used to provide suction to pathway(s) of another mask different in design from mask 404. In a combination of such embodiments, pathway 414 may be used to hold the mask 404 to the mask holder 402 while pathway(s) 408 and 420 may be used to provide suction to pathway(s) of another mask different in design from mask 404. Other suitable combinations are envisioned. In an embodiment, a multiplicity of vacuum pathway(s) in the mask holder 402 are aligned to a multiplicity of vacuum pathway(s) in the mask 404 to provide suction to a multiplicity of microball holder(s) sufficient to match a desired SRO pattern on a microelectronic substrate. The multiplicity of pathways may exceed the number of pathways illustrated. A limited number of pathways is depicted here for ease of illustration.

In an embodiment, mask 404 is removable from mask holder 402. Mask 404 may be interchangeable, allowing for masks of different designs than mask 404 to couple with mask holder 402.

In an embodiment, mask 404 includes one or more first vacuum pathway(s) 426 and 428 and one or more second vacuum pathway(s) 424 and 430. In the illustrated example, one or more first vacuum pathway(s) 426 and 428 are designed to support larger microball(s) than one or more second vacuum pathway(s) 424 and 430 are designed to support. Mask 404 may include many more first vacuum pathway(s) 426 and 428 and second vacuum pathway(s) 424 and 430 to correspond with different-sized microball holders that are arranged to match a desired SRO pattern on a microelectronic substrate.

In another embodiment, the first 426, 428 vacuum pathway(s) of the mask 404 are coupled to first microball holder(s) $306_{1...n}$ such as those depicted in assembly 300 and second 424, 430 vacuum pathway(s) of the mask 404 are coupled to second microball holder(s) $312_{1...n}$ such as those depicted in assembly 300. In one embodiment, the first and second vacuum pathway(s) 424, 426, 428, 430 of the mask are arranged such that the distal surfaces of any attached microball(s) are substantially coplanar, the distal surfaces being distal in relation to the proximal surfaces that are proximate to the first and second vacuum pathway (s) 424, 426, 428, 430. In one example, the first vacuum pathway(s) 426, 428 are designed to hold larger microballs than second vacuum pathway(s) 424, 430 and the first vacuum pathway(s) 426, 428 are recessed 432 toward assembly support 434 by a distance such that the substrate-contacting surfaces of any microballs held by the first and second microball holder(s) are substantially coplanar. Substrate-contacting surface refers to the portion of the microball that is intended or most likely to come into contact with the bonding pads of a microelectronic substrate upon placement and does not necessarily mean that the microball is actually contacting the substrate. The recessed area 432 may provide additional space for larger microballs to facilitate co-planar microball placement. In another example embodiment, the bottoms of any attached balls are substantially coplanar, the bottom being in an orientation directed toward the bottom of the page of FIG. 4.

According to an embodiment, microball delivery assembly 400 includes an assembly support 434 to couple the mask holder 402 and mask 404 with other elements, devices, assemblies, or systems. For example, assembly support 434 may be coupled to a lifting and lowering apparatus to facilitate picking and placing microballs. In one embodiment, assembly support 434 is coupled to one or more system(s) for creating suction and includes vacuum lines to provide differential suction to vacuum lines or pathways in mask holder 402 and mask 404.

In another embodiment, microball delivery assembly 400 is coupled to one or more device(s) or system(s) for creating suction. Device(s) for creating suction may provide differential suction to at least first 410, 412, 416, 418, 426, 428 and second pathway(s) 406, 422, 424, 430 of an assembly to selectively hold and place microballs.

Embodiments describing differential and/or selective vacuum or suction refer to ability to selectively control different amounts of pressure to different pathways. A negative pressure difference may create suction and positive pressure difference may create blowing. Ability to control suction and blowing and/or maintaining no pressure differential to different pathways allows selective picking, holding, and placing of different-sized microballs through different pathways.

Figure 5:
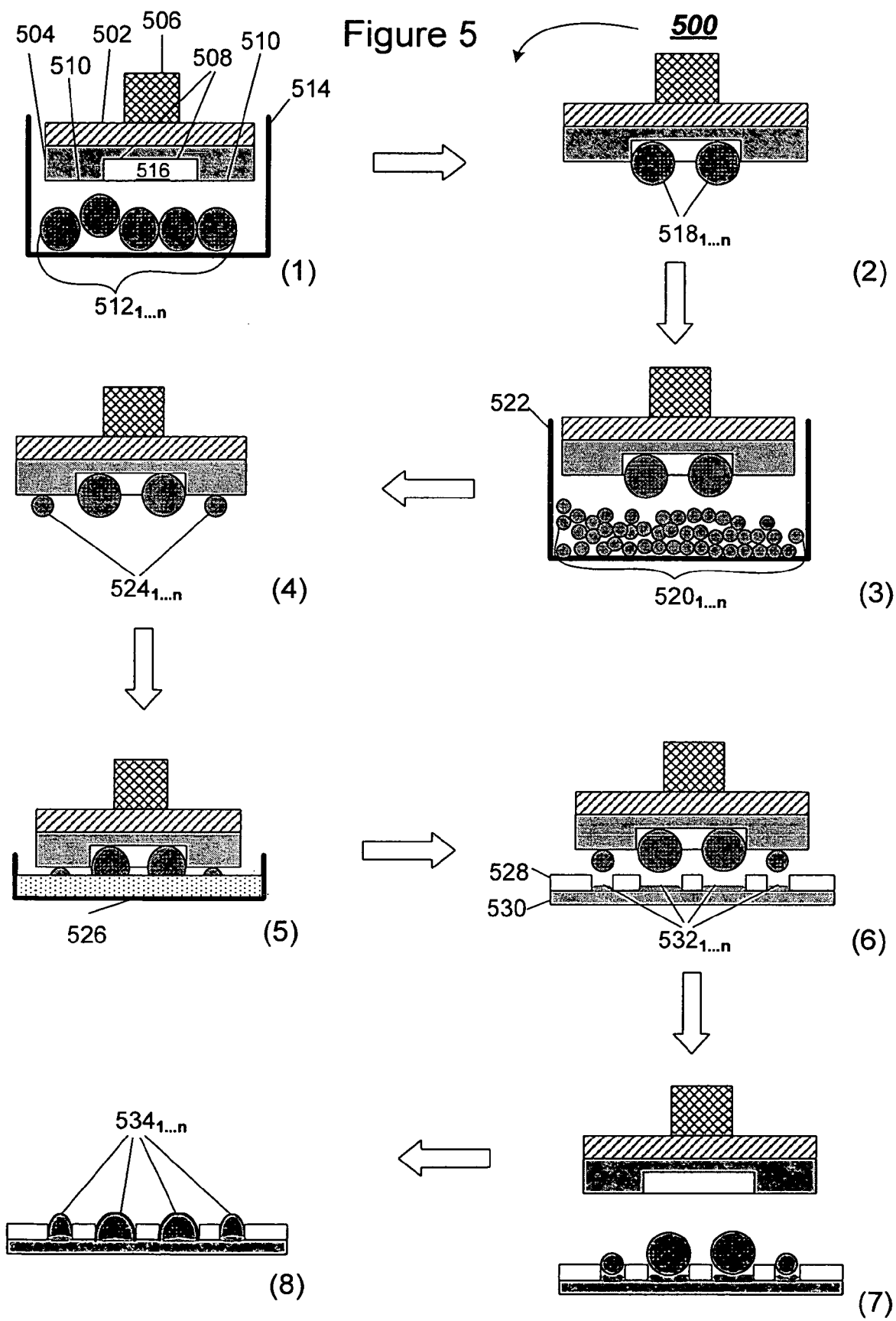
FIG. 5 is an illustrated flow diagram of a microball delivery method, according to but one example embodiment.

FIG. 5 is an illustrated flow diagram of a microball delivery method 500, according to but one example embodiment. In an embodiment, a microball delivery method 500 includes applying suction to one or more first microball holder(s) to hold one or more microball(s) of a first diameter, depicted in at least steps (1) and (2), applying suction to one or more second microball holder(s) to hold one or more microball(s) of a second diameter, depicted in at least steps (3) and (4), and placing one or more microball(s) of a first and second diameter at a selected location, depicted in at least steps (6) and (7). Another embodiment includes fluxing at least a portion of the microball(s) being held by the first and second microball holder(s), depicted in step (5).

For the sake of clarity, elements used in method 500 are labeled only once upon introduction in the flow to avoid obscuring the drawings with excessive labeling. According to but one embodiment, arrows suggest an example flow between steps (1) through (8) in method 500.

Referring to step (1), a mask 504 to accept different-sized microball(s) and hold them is coupled to a mask holder 502. In an embodiment, an assembly support 506 is further coupled to mask holder 502. In one embodiment, mask 504 includes one or more first microball holder(s) 508 and one or more second microball holder(s) 510. Other embodiments may include more first and second microball holder(s) than illustrated. First and second microball holder(s) 508, 510 may be coupled to separate vacuum systems for selective differential suction and blowing. First microball holder(s) 508 are designed to hold and place microball(s) of a first diameter $512_{1...n}$ and second microball holder(s) 510 are designed to hold and place microball(s) of a second diameter $520_{1...n}$.

In one embodiment, one or more first microball holder(s) 508 are a first size and one or more second microball holder(s) 510 are a second size different from the first size. In an embodiment, one or more first microball holder(s) 508 are larger than one or more second microball holder(s) 510. In one embodiment, recessed area 516 provides space for holding larger microball(s) $512_{1...n}$ with first microball holder(s) 508. In another embodiment, mask 504, mask holder 502, and assembly support 506 may incorporate other embodiments already described in FIGS. 3-4.

In one embodiment, a microball delivery assembly comprising at least mask holder 502 and mask 504 is brought near one or more microball(s) of a first diameter $512_{1...n}$. Microball(s) $512_{1...n}$ may be in a container 514. In another embodiment, one or more microball(s) of a first diameter $512_{1...n}$ are brought near mask 504 including first microball holder(s) 508. In this instance, near refers to a distance that allows suction through one or more first microball holder(s) 508 to pick up and/or hold microball(s) of a first diameter $512_{1...n}$. Selective suction is applied at first microball holder(s) 508 to pick up and/or hold microball(s) $512_{1...n}$ of a first diameter. In this regard, according to one embodiment, suction may be applied at first microball holder(s) 508 until each first microball holder(s) 508 holds a microball of a first diameter 512.

In one embodiment, microball(s) of a first diameter $512_{1...n}$ are larger than microball(s) of a second diameter $520_{1...n}$. In one embodiment, one or more second microball holder(s) 510 are designed so that they cannot support the weight of microball(s) of a first diameter $512_{1...n}$. Such embodiment may prevent microball(s) of a first diameter $512_{1...n}$ from adhering to second microball holder(s) 510 if suction is applied to second microball holder(s) 510 while near microball(s) of a first diameter $512_{1...n}$. In another embodiment, no suction is applied at the second microball holder(s) 510 when suction is applied at the first microball holder(s) 510. In yet another embodiment, slight positive pressure or blowing is applied at the second microball holder(s) 510 at least while near unheld first microball(s) $512_{1...n}$ of a first diameter to prevent accidental adherence.

Referring to step (2), microball delivery assembly including at least mask 504 maintains sufficient suction to hold and carry one or more microball(s) of a first diameter $518_{1...n}$.

Referring to step (3), a microball delivery assembly comprising at least mask 504 is brought near one or more microball(s) of a second diameter $520_{1...n}$ according to one embodiment. Microball(s) $520_{1...n}$ may be in a container 522. In another embodiment, one or more microball(s) of a second diameter $520_{1...n}$ are brought near mask 504 including second microball holder(s) 510. In this instance, near refers to a distance that allows suction through one or more second microball holder(s) 510 to pick up and/or hold microball(s) of a second diameter $520_{1...n}$. Selective suction is applied at second microball holder(s) 510 to pick up and/or hold microball(s) $520_{1...n}$ of a second diameter. In this regard, according to one embodiment, suction may be applied at second microball holder(s) 510 until each second microball holder(s) 510 holds a microball of a second diameter 520.

Referring to step (4), according to an embodiment, selective suction is applied through one or more first microball holder(s) 508 to hold one or more microball(s) of a first diameter $518_{1...n}$ and selective suction is applied through one or more second microball holder(s) 510 to hold one or more microball(s) of a second diameter $524_{1...n}$ while the one or more first microball holder(s) 508 hold one or more microball(s) of a first diameter $518_{1...n}$. In one embodiment the first diameter and second diameter are different in size. In one embodiment, the second microball holder(s) 510 are coupled to a microball delivery assembly that includes the one or more first microball holder(s) 508. In an embodiment, one or more first microball holder(s) 508 are a first size and one or more second microball holder(s) 510 are a second size different than the first size.

In another embodiment, selective suction is applied to other microball holder(s) (not shown) in addition to the first and second microball holder(s) 508, 510 that are coupled to mask 504 to hold one or more microball(s) of a diameter different than the first and second diameters. In other words, embodiments include a mask 504 with more than two types or sizes of microball holder(s), including three or more types or sizes, each type or size adapted to hold and place a different size of microball.

According to an embodiment, the first 508 and second 510 microball holder(s) are arranged such that the distal surfaces of any attached microball(s) $518_{1...n}$, $524_{1...n}$ are substantially coplanar, the distal surfaces being distal in relation to the proximal surfaces that are proximate to the first 508 and second 510 microball holder(s). In one example, the first microball holder(s) 508 are designed to hold larger microball(s) than second microball holders 510 are designed to hold and the first microball holder(s) 508 are recessed toward mask holder 502 by a distance such that the substrate-contacting surfaces of any microballs held by the first 508 and second 510 microball holder(s) are substantially coplanar. Substrate-contacting surface refers to the portion of the microball that is intended or most likely to come into contact with the bonding pads $532_{1...n}$ of a microelectronic substrate 530 upon placement and does not necessarily mean that the microball is actually contacting the substrate 530 or pads $532_{1...n}$. In another example embodiment, the bottoms of any attached ball(s) $518_{1...n}$, $524_{1...n}$ are substantially coplanar, the bottom being in an orientation directed toward the bottom of the page of FIG. 5.

Referring to step (5), method 500 includes fluxing at least a portion of microballs $518_{1...n}$, $524_{1...n}$ held by the first and second microball holder(s) 508, 510 according to one embodiment. In an embodiment, microballs $518_{1...n}$, $524_{1...n}$ held by mask 504 are partially submerged in a flux bath 526. Fluxing provides a way to transfer flux onto the substrate pads $532_{1...n}$ and remove any oxides present on the pads $532_{1...n}$. Flux removes oxides on the fluxed portions of the microballs as well although significant native oxide is not expected on the microball surface as microball manufacture and packing is typically done under a non-oxidizing nitrogen or argon atmosphere reducing the need for extensive pre-fluxing of the microballs.

Referring to step (6), method 500 includes aligning the microball(s) $518_{1...n}$, $524_{1...n}$ held by mask 504 with a microelectronic substrate such that the arrangement of microball(s) $518_{1...n}$, $524_{1...n}$ held by the assembly substantially overlaps openings for the microball(s) on the substrate 530, according to but one embodiment. Such alignment may occur by transferring the microballs $518_{1...n}$, $524_{1...n}$ over the substrate 530 or by transferring the substrate 530 under the microballs $518_{1...n}$, $524_{1...n}$ for example. In one embodiment, openings for the microball(s) on the substrate 530 occur in a solder resist layer 528 called solder resist openings (SRO). Bonding pads $532_{1...n}$ may be located on substrate 530 between SROs. SROs may be different sizes to accept different-sized microballs and may occur at different pitches. In an embodiment, microball holder(s) 508 and 510 are arranged to match a desired SRO map pattern on a microelectronic substrate 530.

Referring to step (7), method 500 includes placing the one or more microball(s) $518_{1...n}$, $524_{1...n}$ of a first and second diameter at a selected location, according to but one embodiment. Placing the one or more microball(s) $518_{1...n}$, $524_{1...n}$ of a first and second diameter may include aligning the microball(s) $518_{1...n}$, $524_{1...n}$ held by the microball holder(s) 508, 510 with a substrate 530 such that the arrangement of microball(s) $518_{1...n}$, $524_{1...n}$ held by the assembly substantially overlaps openings for the microball(s) on the substrate 530. In another embodiment, placing includes placing the microball(s) held by the microball holder(s) 508, 510 into corresponding openings on the substrate by selectively releasing suction to the first 508 and second 510 microball holder(s). For example, placing may be accomplished by lowering microball holder(s) 508, 510 or raising substrate 530 until the held microball(s) $518_{1...n}$, $524_{1...n}$ contact bonding pads $532_{1...n}$ and are released. In an embodiment, slight positive pressure is selectively applied to all microball holder(s) 508, 510 for which placement is desired to gently dislodge any microballs $518_{1...n}$, $524_{1...n}$ adhering to the mask 504.

Referring to step (8), method 500 includes reflow and cleaning procedures according to but one embodiment. In an embodiment, microballs $518_{1...n}$, $524_{1...n}$ comprise solderable material and are reflowed to form bumps $534_{1...n}$ on the surface of a microelectronic substrate. Cleaning procedures may include washing off flux residue. In an embodiment, high pressure water is used for cleaning the bumped substrate 530.

Figure 6:
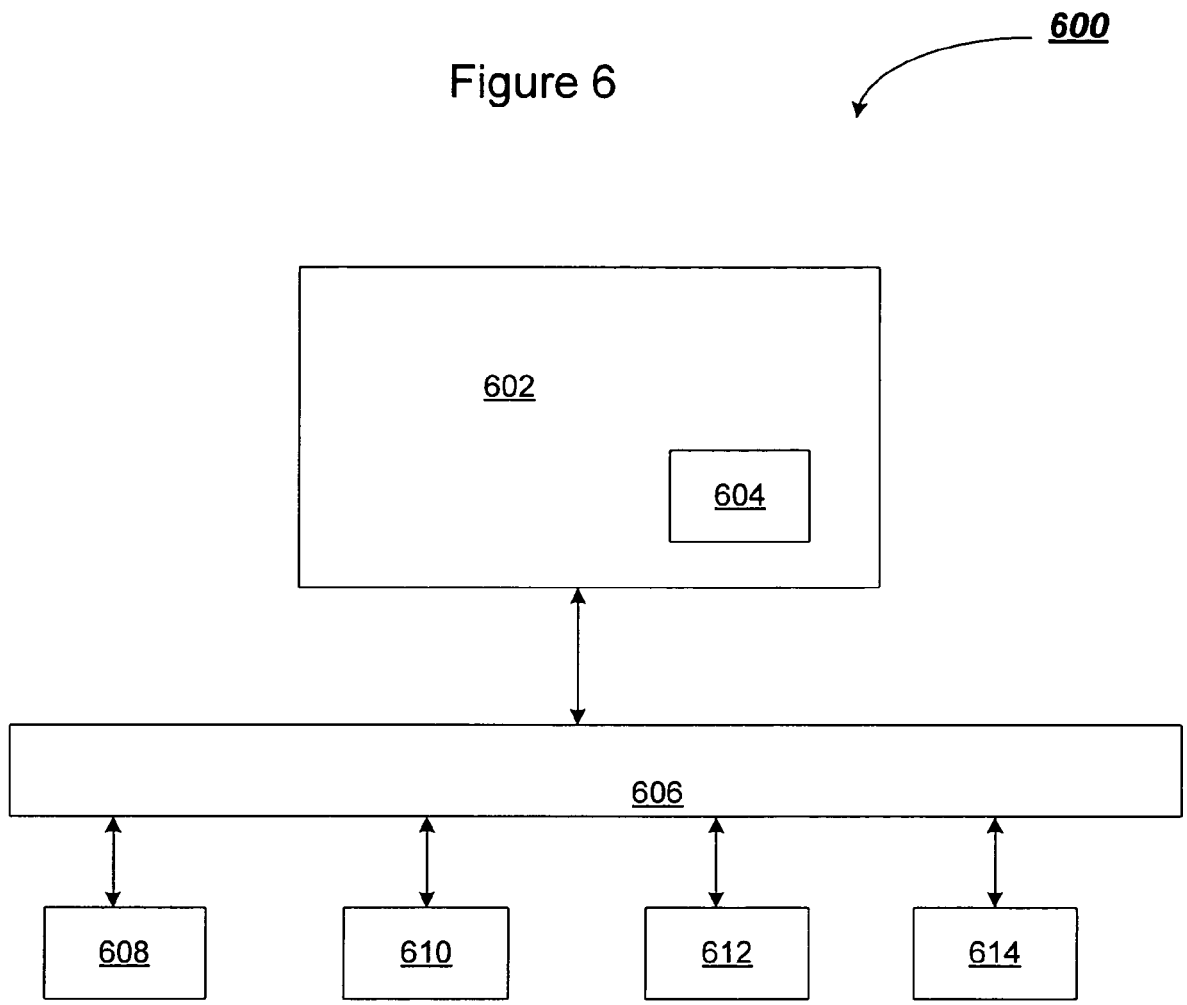
FIG. 6 is one of many possible systems in which embodiments of the present invention may be used.

FIG. 6 is a depiction of but one system 600 of many possible systems in which embodiments of the present invention may be used. In one embodiment, an electronic assembly 602 includes a microelectronic package 604 including a solder-bumped substrate, such as the product shown in step (8) of FIG. 5. Assembly 602 may further include a microprocessor. In an alternate embodiment, the electronic assembly 602 may include an application specific IC (ASIC). Integrated circuits found in chipsets (e.g., graphics, sound, and control chipsets) may also be packaged in accordance with embodiments of this invention.

For the embodiment depicted by FIG. 6, the system 600 may also include a main memory 608, a graphics processor 610, a mass storage device 612, and/or an input/output module 614 coupled to each other by way of a bus 606, as shown. Examples of the memory 608 include but are not limited to static random access memory (SRAM) and dynamic random access memory (DRAM). Examples of the mass storage device 612 include but are not limited to a hard disk drive, a compact disk drive (CD), a digital versatile disk drive (DVD), and so forth. Examples of the input/output module 614 include but are not limited to a keyboard, cursor control arrangements, a display, a network interface, and so forth. Examples of the bus 606 include but are not limited to a peripheral control interface (PCI) bus, and Industry Standard Architecture (ISA) bus, and so forth. In various embodiments, the system 600 may be a wireless mobile phone, a personal digital assistant, a pocket PC, a tablet PC, a notebook PC, a desktop computer, a set-top box, a media-center PC, a DVD player, or a server.

Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments. For example, in FIG. 5, smaller microballs may be picked up and held by a mask before larger microballs are picked up and held or, in another example, larger balls may be picked up at the periphery of a mask while smaller balls are picked up near the center of a mask. Some operations such as fluxing may be omitted completely. Other such modifications fall within the spirit of this description.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A microball delivery assembly comprising:
   a mask holder; and
   a mask coupled to the mask holder, the mask including one or more first microball holder(s) to hold one or more microball(s) of a first diameter and one or more second microball holder(s) to hold one or more microball(s) of a second diameter different from the first diameter, wherein the one or more first microball holder(s) are a first size and the one or more second microball holder(s) are a second size different than the first size.

2. A microball delivery assembly according to claim 1, wherein the mask holder comprises:
   one or more first vacuum pathway(s) to provide selective suction and hold the one or more microball(s) of a first diameter through the one or more first microball holder(s); and
   one or more second vacuum pathway(s) to provide selective suction and hold the one or more microball(s) of a second diameter through the one or more second microball holder(s).

3. A microball delivery assembly according to claim 2, further comprising:
   one or more other microball holder(s) coupled to the mask; and
   one or more other vacuum pathway(s) to provide selective suction and hold the one or more microball(s) of other diameters through one or more other microball holder(s).

4. A microball delivery assembly according to claim 1, wherein the mask is removable and interchangeable from the mask holder.

5. A microball delivery assembly according to claim 1, wherein the first and second microball holder(s) are arranged such that the distal surfaces of any attached microball(s) are substantially coplanar, the distal surfaces being distal in relation to the proximal surfaces that are proximate to the first and second microball holder(s).

6. A microball delivery assembly according to claim 1, wherein the first and second microball holder(s) are arranged to match a selected microball placement pattern on the surface of a substrate.

7. A microball delivery assembly according to claim 1, further comprising:
   one or more device(s) for creating suction coupled with the mask holder to provide differential suction to the mask for selectively holding and placing different-sized microball(s).

8. A microball delivery assembly according to claim 1, wherein the first and second microball holder(s) hold and place microballs, the microballs ranging between about 40-200 microns in diameter and comprising solderable material for bumping the surface of a microelectronic substrate.

9. A microball delivery assembly according to claim 1, wherein the one or more first microball holder(s) are larger than the one or more second microball holder(s).

10. A microball delivery assembly according to claim 1, wherein the one or more second microball holder(s) are able to support the weight of microball(s) associated with the second microball holder(s), but are not able to support the weight of microball(s) associated with the first microball holder(s).

11. A microball delivery method comprising:
applying selective suction through one or more first microball holder(s) to hold one or more microball(s) of a first diameter,
applying selective suction to one or more second microball holder(s) to hold one or more microball(s) of a second diameter, different from the first diameter, while the one or more first microball holder(s) hold one or more microball(s) of a first diameter, the second microball holder(s) coupled to a microball delivery assembly that includes the one or more first microball holder(s), wherein the one or more first microball holder(s) are a first size and the one or more second microball holder(s) are a second size different than the first size; and
placing the one or more microball(s) of a first and second diameter at a selected location.

12. A method according to claim 11, further comprising:
applying selective suction to one or more other microball holder(s) coupled to the microball delivery assembly that are not the first and second microball holder(s) to hold one or more microball(s) of a diameter different than the first and second diameters.

13. A method according to claim 11, further comprising:
fluxing at least a portion of the microball(s) being held by the first and second microball holder(s).

14. A method according to claim 11, wherein the one or more microball(s) of a first diameter are larger than the one or more microball(s) of a second diameter.

15. A method according to claim 11, wherein placing the one or more microball(s) comprises:
aligning the microball(s) held by the microball delivery assembly with a substrate such that the arrangement of microball(s) held by the assembly substantially overlaps openings for the microball(s) on the substrate;
placing the microball(s) held by the microball delivery assembly into the corresponding openings on the substrate by selectively releasing suction to the first and second microball holder(s).

16. A method according to claim 15, further comprising:
reflowing the microballs onto the substrate; and
cleaning the reflowed substrate surface.

17. A method according to claim 11, further comprising:
applying slight positive pressure to the second microball holder(s) prior to applying selective suction to the second microball holder(s) to prevent microball(s) of a first diameter from adhering to the second microball holder(s) while applying selective suction through one or more first microball holder(s).

18. A method according to claim 11, further comprising:
applying slight positive pressure to the first and second microball holder(s) upon placing the one or more microball(s) of a first and second diameter.

19. A method according to claim 11, comprising
providing an arrangement of first and second microball holder(s) to hold the microball(s) such that the distal surfaces of held microball(s) are substantially coplanar, the distal surfaces being distal in relation to the proximal surfaces that are proximate to the first and second microball holder(s).

20. A microball delivery assembly comprising:
a mask holder;
a mask including one or more first microball holder(s) to hold microball(s) of a first diameter and one or more second microball holder(s) to hold microball(s) of a second diameter different from the first diameter, the mask being coupled with the mask holder, wherein the one or more first microball holder(s) are a first size and the one or more second microball holder(s) are a second size different than the first size; and
one or more device(s) for creating suction coupled with the mask holder to provide differential suction to the mask for selectively holding and placing different-sized microball(s) into corresponding openings on a microelectronic substrate.

21. A microball delivery assembly according to claim 20, wherein the mask holder comprises:
one or more first vacuum pathway(s) to provide selective suction and hold the one or more microball(s) of a first diameter through the one or more first microball holder(s); and
one or more second vacuum pathway(s) to provide selective suction and hold the one or more microball(s) of a second diameter through the one or more second microball holder(s).

22. A microball delivery assembly according to claim 21, wherein the mask includes one or more other microball holder(s) coupled to the mask and wherein the mask holder further comprises:
one or more other vacuum pathway(s) to provide selective suction and hold the one or more microball(s) of other diameters through one or more other microball holder(s).

* * * * *